US010115441B1

United States Patent
Yang et al.

(10) Patent No.: US 10,115,441 B1
(45) Date of Patent: Oct. 30, 2018

(54) ROW DECODER AND MEMORY SYSTEM USING THE SAME

(71) Applicant: MACRONIX INTERNATIONAL CO., LTD., Hsinchu (TW)

(72) Inventors: Shang-Chi Yang, Changhua County (TW); Chun-Yu Liao, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/654,752

(22) Filed: Jul. 20, 2017

(51) Int. Cl.
- *G11C 8/00* (2006.01)
- *G11C 8/10* (2006.01)
- *G11C 8/12* (2006.01)
- *G06F 11/10* (2006.01)
- *G11C 8/08* (2006.01)
- *G11C 16/34* (2006.01)
- *G11C 17/18* (2006.01)

(52) U.S. Cl.
CPC ............ *G11C 8/10* (2013.01); *G06F 11/1016* (2013.01); *G06F 11/1048* (2013.01); *G11C 8/08* (2013.01); *G11C 8/12* (2013.01); *G11C 16/3427* (2013.01); *G11C 17/18* (2013.01)

(58) Field of Classification Search
CPC ....... G11C 8/10; G11C 16/08; G11C 16/0483; G11C 8/08; G11C 13/0028; G11C 16/16; G11C 8/14; G11C 16/12; G11C 8/12; G11C 16/10; G11C 13/0004; G11C 5/025; G11C 13/0023

USPC ............ 365/230.06, 185.23, 230.03, 185.11, 365/185.18, 63, 185.17, 185.13, 189.11, 365/185.12, 51, 148, 185.29, 200, 203
See application file for complete search history.

(56) References Cited

U.S. PATENT DOCUMENTS

| | | | |
|---|---|---|---|
| 5,732,017 A | 3/1998 | Schumann et al. | |
| 5,970,016 A | 10/1999 | Ohsawa | |
| 6,021,088 A | 2/2000 | Kim | |
| 6,118,726 A | 9/2000 | Ji et al. | |
| 6,603,703 B2 | 8/2003 | Lines | |
| 2012/0314505 A1* | 12/2012 | Nam | G11C 16/0425 365/185.23 |
| 2015/0220441 A1 | 8/2015 | Eggleston | |

OTHER PUBLICATIONS

TIPO Office Action dated Mar. 7, 2018 in Taiwan application (No. 106127375).

\* cited by examiner

*Primary Examiner* — Thong Q Le
(74) *Attorney, Agent, or Firm* — McClure, Qualey & Rodack, LLP

(57) ABSTRACT

A row decoder includes a plurality of address lines, a first selection circuit and a second selection circuit. The first selection circuit is coupled to the address lines and with a latch function, and configured to enable and latch a first selection signal to select a first word line in a first cell array. The second selection circuit is coupled to the address lines and without the latch function, and configured to enable a second selection signal to select a second word line in a second cell array.

15 Claims, 4 Drawing Sheets

ROW DECODER AND MEMORY SYSTEM USING THE SAME

TECHNICAL FIELD

The present disclosure is generally related to a row decoder and memory system using the same.

BACKGROUND

Memory devices have been widely used in various electrical products. Memory devices typically include a plurality of word lines, bit lines and memory cells coupled to the word lines and bit lines. When a word line is selected, memory cells coupled to the selected word line are accessed. Generally, the selection for the word lines can be done through decoding address information by a row decoder.

To improve memory performance, memory devices may employ shared row decoders. With the shared row decoder, two or more cell arrays in a memory device can be individually operated at the same time, such as read while read or read while write. However, conventional shared row decoders need a large number of address lines for individually operating all cell arrays, which occupy large circuit area and line routing.

SUMMARY

The present disclosure relates to a row decoder and memory system using the same. The row decoder may include one or more selection circuit pairs for selecting word lines in a first cell array and a second cell array of a memory device. Each selection circuit pair may include a first selection circuit and a second selection circuit. The first selection circuit may include a first word line driver with a latch function. The second selection circuit may include a second word line driver without the latch function. Address transform logic may sequentially provide address signals to a set of address lines for individually operating the first and second cell arrays at the same time, such as read while read or read while write. With the proposed row decoder, the first and second selection circuits in a selection circuit pair may share the same address lines, so line routing and occupied circuit area can be reduced.

According to one embodiment, a row decoder is provided. The row decoder includes a plurality of address lines, a first selection circuit and a second selection circuit. The first selection circuit is coupled to the address lines and with a latch function, and configured to enable and latch a first selection signal to select a first word line in a first cell array. The second selection circuit is coupled to the address lines and without the latch function, and configured to enable a second selection signal to select a second word line in a second cell array.

According to another embodiment, a memory system is provided. The memory system includes a first cell array, a second cell array, an address transform logic and a row decoder. The first cell array includes a first word line. The second cell array includes a second word line. The address transform logic is configured to provide a plurality of address signals for accessing the first cell array and the second cell array, wherein the address signals includes a first address signal and a second address signal. The row decoder is coupled to the first cell array and the second cell array, and includes a plurality of address lines, a first selection circuit and a second selection circuit. The address lines are coupled to the address transform logic, and configured to receive the address signals from the address transform logic sequentially. The first selection circuit is coupled to the address lines and with a latch function, and configured to enable and latch a first selection signal to select the first word line in response to the first address signal. The second selection circuit is coupled to the address lines and without the latch function, and configured to enable a second selection signal to select the second word line in response to the second address signal.

Figure 1:
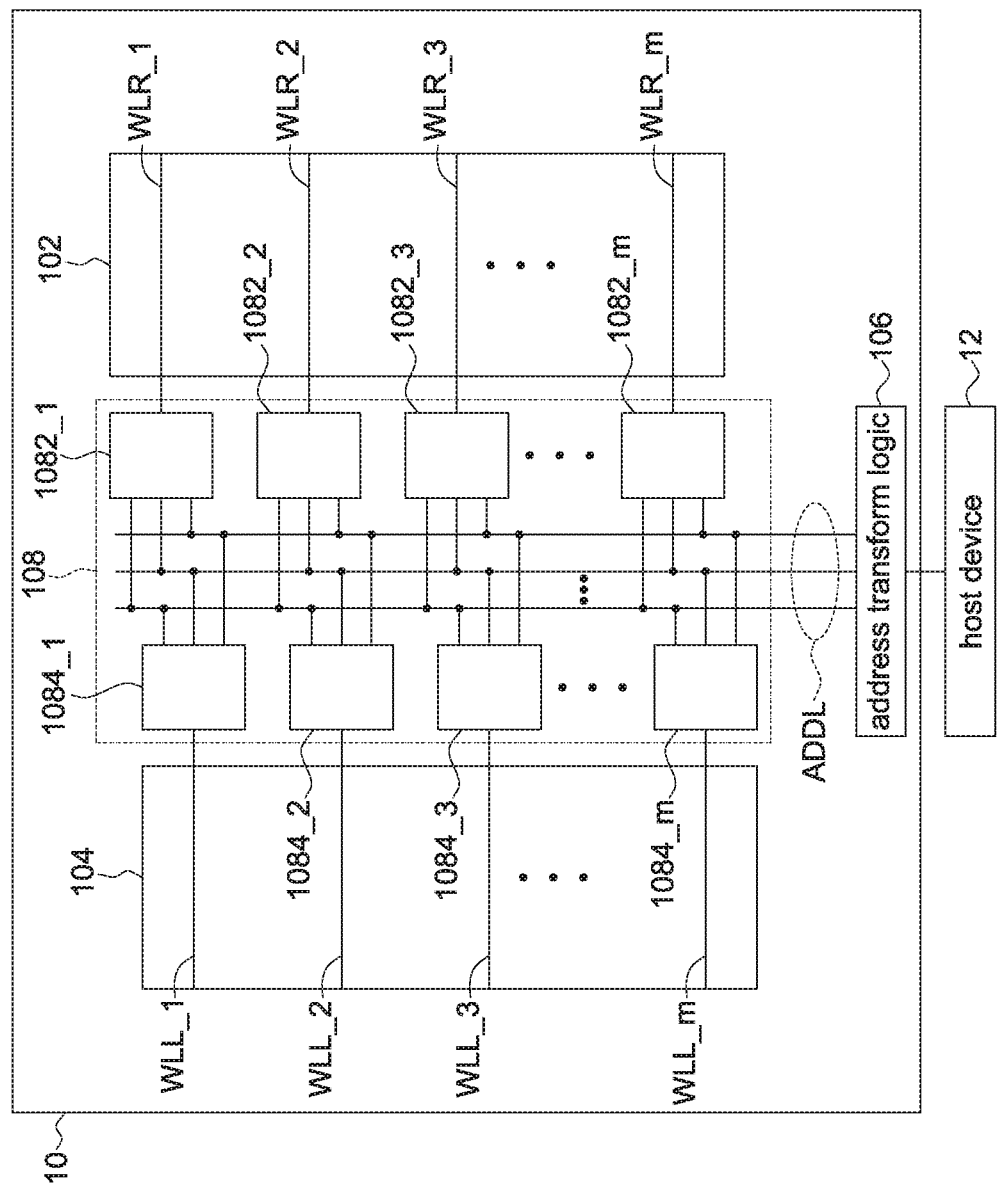
FIG. 1 is a block diagram illustrating a memory system in accordance with an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIG. 1 is a block diagram illustrating a memory system 10 in accordance with an embodiment of the present disclosure. The memory system 10 includes a first cell array 102, a second cell array 104, address transform logic 106 and a row decoder 108.

Each of the first cell array 102 and the second cell array 104 may include a plurality of memory cells located at the cross sections of word lines and bit lines. In this example, the first cell array 102 includes a plurality of word lines WLR_1-WLR_m, and the second cell array 104 includes a plurality of word lines WLL_1-WLL_m, where m is a positive integral. During a read cycle, when a word line is selected, data in the memory cells coupled to the selected word line will be outputted though the bit lines (not illustrated).

The address transform logic 106 may provide address signals to the address lines ADDL in response to one or more requests from a host device 12. Each address signal is corresponding to a physical location in the first cell array 102 or the second cell array 104. The address transform logic 106 can be realized by logical circuits for example.

The row decoder 108 is coupled to the first cell array 102 and the second cell array 104. The row decoder 108 may select word lines in the first cell array 102 and/or the second cell array 104 in response to the address signals provided by the address transform logic 106.

The row decoder 108 includes a plurality of address lines ADDL, a plurality of selection circuits 1082_1-1082_$m$ for the first cell array 102 and a plurality of selection circuits 1084_1-1084_$m$ for the second cell array 104.

The selection circuits 1082_1-1082_$m$ and 1084_1-1084_$m$ share the address lines ADDL. Each selection circuit may respond a matched address signal to enable a selection signal to select a corresponding word line.

For example, when the selection circuit 1082_1 receives a matched address signal from the address lines ADDL, the selection circuit 1082_1 enables a selection signal for selecting the word line WLR_1, so that the word line WLR_1 is selected. In the case that the selection signal for the word line WLR_1 becomes disabled, the word line WLR_1 is deselected.

In this embodiment, a pair of selection circuits corresponding to the same row of word lines in the first and second cell arrays 102, 104 is deemed as a selection circuit pair. For example, the selection circuits 1082_1 and 1084_1 may form a selection circuit pair, for selecting the first row of word lines WLR_1 and WLL_1 in the first and second cell arrays 102, 104.

According to embodiments of the present disclosure, for the two selection circuits in a single selection circuit pair, one (which is referred to as a first selection circuit) is realized by a word line driver with a latch function, and the other one (which is referred to as a second selection circuit) is realized by a word line driver without a latch function. Taking FIG. 1 as an example, in an embodiment, the selection circuits 1082_1-1082_m for the first cell array 102 are implemented as first selection circuits, while the selection circuits 1084_1-1084_m for the second cell array 104 are implemented as second selection circuits. In another embodiment, the selection circuits 1082_1-1082_m are implemented as second selection circuits, while the selection circuits 1084_1-1084_m are implemented as first selection circuits. In yet another embodiment, some selection circuits 1082_1-1082_m are first selection circuits, and others are second selection circuits; some selection circuits 1084_1-1084_m are second selection circuits, and others are first selection circuits.

The first selection circuit can hold the state of a selected word line even when receiving an unmatched address signal. With this feature, the first and second cell arrays 102, 104 can be individually operated at the same time by sequentially providing the first and second selection circuits matched address signals. Because the first and second selection circuits share the same address lines ADDL, line routing and occupied circuit areas can be significantly reduced.

Figure 2:
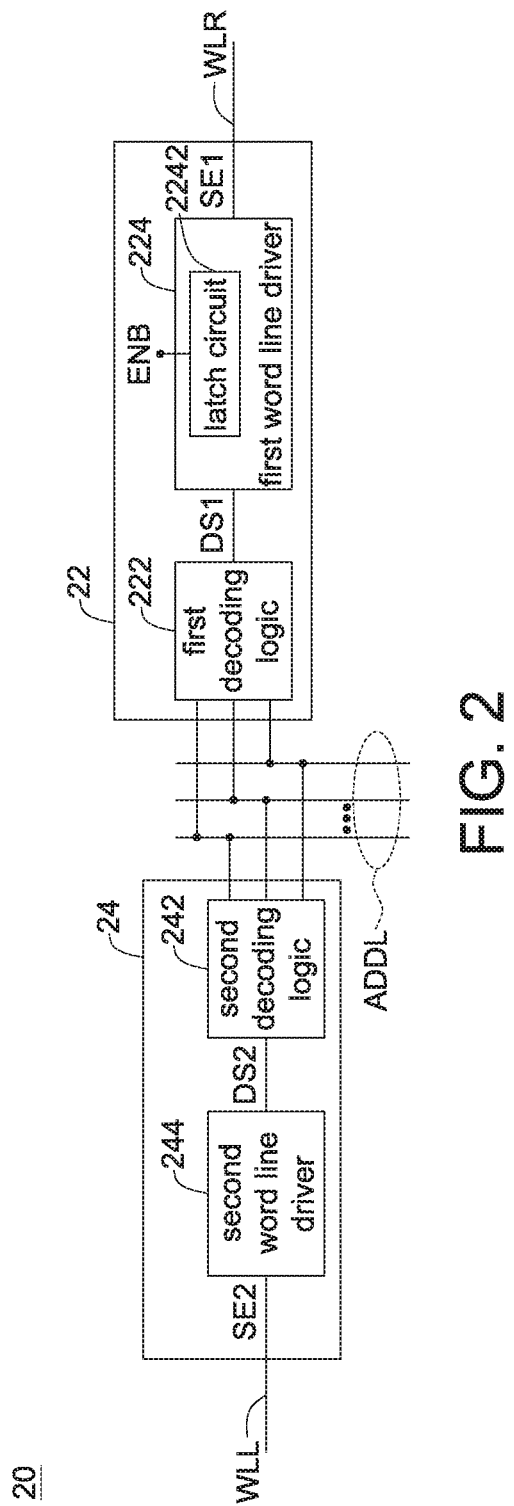
FIG. 2 is a block diagram illustrating a row decoder in accordance with an embodiment of the present disclosure.

FIG. 2 is a block diagram illustrating a row decoder 20 in accordance with an embodiment of the present disclosure. The row decoder 20 may include one or more selection circuit pairs. In this example, the row decoder 20 is exemplified as including only one selection circuit pair.

As shown in FIG. 2, the selection circuit pair includes a first selection circuit 22 for selecting a first word line WLR and a second selection circuit 24 for selecting a second word line WLL.

Taking FIG. 1 as an example, if the first selection circuit 22 and the second selection circuit 24 are selection circuits 1082_1 and 1084_1, respectively, the first word line WLR represents the word line WLR_1, and the second word line WLL represents the word line WLL_1. Note that the example is just for the purpose of illustrating the invention and not for the purpose of limiting the same. In some embodiments, the first word line WLR can be the i-th row of word line on the first cell array 102 and selected by the corresponding selection circuit 1082_i, and the second word line WLL can be the j-th row of word line on the second cell array 104 and selected by the corresponding selection circuit 1084_j, where i and j may be the same or different from each other.

The first selection circuit 22 and the second selection circuit 24 share the same address lines ADDL and receive address signals from the address lines ADDL. The address signals provided on the address lines ADDL may include a first address signal and a second address signal.

The first selection circuit 22 is coupled to the address lines ADDL and with a latch function, and is configured to enable and latch a first selection signal SE1 to select the first word line WLR in the first cell array 102.

As shown in FIG. 2, the first selection circuit 22 includes a first decoding logic 222 and a first word line driver 224. The first decoding logic 222 is coupled to the address lines ADDL, and is configured to enable a first driving signal DS1 in response to the first address signal and disable the first driving signal DS1 in response to other address signals (e.g., the second address signal) on the address lines ADDL.

The first word line driver 224 is coupled to the first decoding logic 222 and includes a latch circuit 2242. The latch circuit 2242 is controlled by a latch control signal ENB. The latch circuit 2242 enables the first selection signal SE1 when the first driving signal DS1 is enabled during a period of time that the latch control signal ENB is enabled, and keeps outputting the enabled first selection signal SE1 after the latch control signal ENB becomes disabled.

In the present disclosure, the terms "enabled" and "disabled" refer to different level states of a signal. In an illustrative and non-limiting example, a signal is enabled when it is pulled high, and is disabled when it is pulled low.

The second selection circuit 24 is coupled to the address lines ADDL and without the latch function, and is configured to enable a second selection signal SE2 to select the second word line WLL in the second cell array 104.

The second selection circuit 24 includes a second decoding logic 242 and a second word line driver 244. The second decoding logic 242 is coupled to the address lines ADDL, and is configured to enable a second driving signal DS2 in response to the second address signal and disable the second driving signal DS2 in response to other address signals (e.g., the first address signal) on the address lines ADDL.

The second word line driver 244 is coupled to the second decoding logic 242. The second word line driver 244 enables the second selection signal SE2 to select the second word line WLL when the second driving signal DS2 is enabled, and disables the second selection signal SE2 to deselect the second word line WLL when the second driving signal DS2 is disabled.

Figure 3:
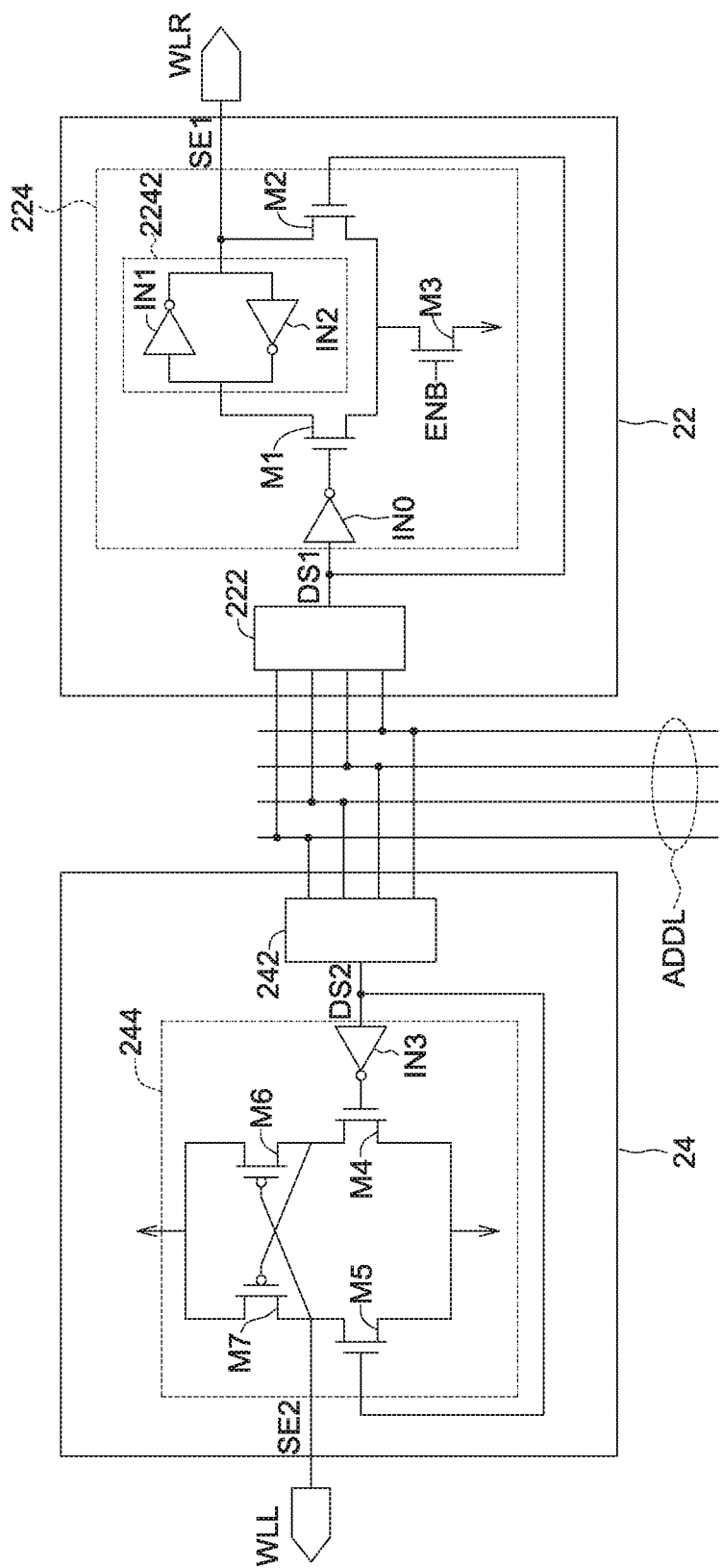
FIG. 3 is a circuit diagram of the row decoder in accordance with an embodiment of the present disclosure.

FIG. 3 is a circuit diagram of the row decoder 20 in accordance with an embodiment of the present disclosure.

As shown in FIG. 3, the first word line driver 224 mainly includes inverters IN0-IN2 and transistors M1-M3. The transistors M1-M3 may be N-type Metal-Oxide-Semiconductors (NMOSs). The control terminals (e.g., gate) of the transistors M1, M2 are coupled to the output of the inverter IN0 and the output of the first decoding logic 222, respectively. The input and output of the inverter IN1 are coupled to the output and input of the inverter IN2, respectively, forming a latch circuit 2242. The latch circuit 2242 is coupled between first terminals (e.g., drain) of the transistors M1 and M2. The latch circuit 2242 is further coupled to the first word line WLR to apply it the first selection signal SE1.

The second terminals (e.g., source) of the transistors M1, M2 are commonly coupled to the transistor M3. The transistor M3 is controlled by the latch control signal ENB. When the latch control signal ENB is enabled, the state (enabled/disabled) of the first selection signal SE1 follows the state of the first driving signal DS1. When the latch control signal ENB is disabled, the state of the first selection signal SE1 is latched, and does not vary with the first driving signal DS1.

The second word line driver 244 includes an inverter IN3 and transistors M4-M7. For example, the transistors M4 and M5 are NMOSs, and M6 and M7 are P-type Metal-Oxide-Semiconductors (PMOSs). As shown in FIG. 3, the transistors M4-M7 form a level shifter.

It is noted that the circuit structure of the row decoder 20 is not limited to the above examples. For example, the first word line driver 224 in the row decoder 20 can be realized by incorporating a latch circuit into an existing word line driver structure. Also, the second word line driver can be realized by any type of level shifter.

Figure 4:
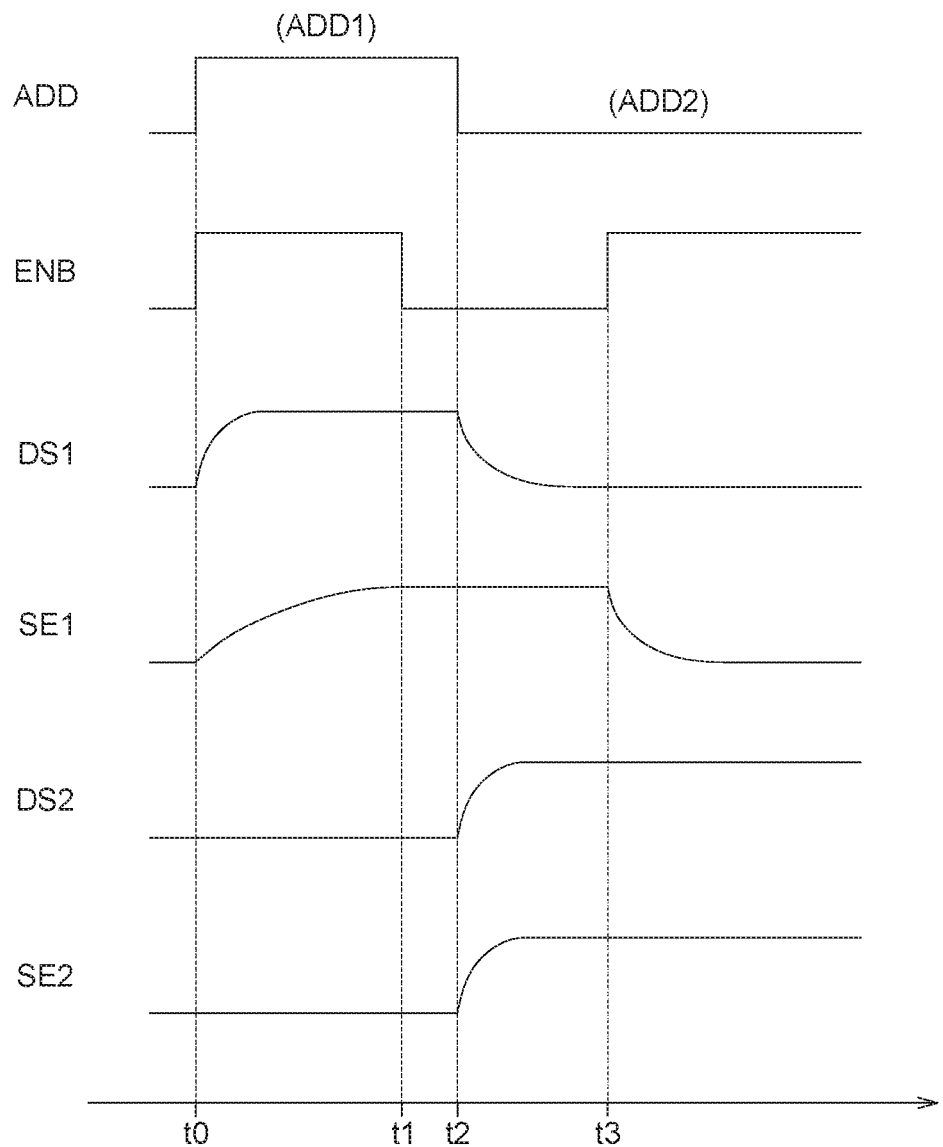
FIG. 4 illustrates signal waveforms associated with the row decoder in accordance with an embodiment of the present disclosure.

FIG. 4 illustrates signal waveforms associated with the row decoder 20 in accordance with an embodiment of the present disclosure.

Please refer to FIGS. 2 and 4. During the time interval t0-t2, an address signal ADD on the address lines ADDL is the first address signal ADD1. At time point t2, the first address signal ADD1 is changed to the second address signal ADD2. The first address signal ADD1 is matched to the first selection circuit 22. The second address signal ADD2 is matched to the second selection circuit 24. Therefore, the first driving signal DS1 provided by the first decoding logic 222 of the first selection circuit 22 is enabled during the time interval t0-t2, and becomes disabled after the time point t2. On the contrary, the second driving signal DS2 provided by the second decoding logic 242 of the second selection circuit 24 is disabled during the time interval t0-t2, and becomes enabled after the time point t2.

When the second driving signal DS2 is disabled, the second word line driver 244 disables the second selection signal SE2 to deselect the second word line WLL. Conversely, when the second driving signal DS2 is enabled, the second word line driver 244 enables the second selection signal SE2 to select the second word line WLL.

During the time interval t0-t1, the latch control signal ENB is enabled. In this period of time, the first word line driver 224 enables the first selection signal SE1 when the first driving signal DS1 is enabled.

In this example, the pulse duration (t0-t1) that the latch control signal ENB is enabled is shorter than the pulse duration (t0-t2) that the first driving signal DS1 is enabled.

During the time interval t1-t3, the latch control signal ENB is disabled. In this period of time, the first word line driver 224 latches the enabled first selection signal SE1 to maintain the first word line WLR in a selected condition, no matter whether the first driving signal DS1 is enabled or disabled.

At the time point t2, the first address signal ADD1 on the address lines ADDL is switched to the second address signal ADD2 that is matched to the second selection circuit 24. Meanwhile, the first selection signal SE1 is still latched on an enabled condition.

At the time point t3, the latch control signal ENB is enabled again. At this time, the latch circuit 2242 disables first selection signal SE1 to deselect the first word line WLR in response to receiving the disabled first driving signal DS1.

Based on the above, the present disclosure provides a row decoder and memory system using the same. The row decoder may include one or more selection circuit pairs for selecting word lines in a first cell array and a second cell array of a memory device. Each selection circuit pair may include a first selection circuit and a second selection circuit. The first selection circuit may include a first word line driver with a latch function. The second selection circuit may include a second word line driver without the latch function. Address transform logic may sequentially provide address signals to a set of address lines for individually operating the first and second cell arrays at the same time, such as read while read or read while write. With the proposed row decoder, the first and second selection circuits in a selection circuit pair may share the same address lines, so line routing and occupied circuit area can be reduced.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A row decoder, comprising:
a plurality of address lines;
a first selection circuit coupled to the address lines and with a latch function, configured to decode address signals on the address lines, enable and latch a first selection signal to select a first word line in a first cell array; and
a second selection circuit coupled to the address lines and without the latch function, configured to decode the address signals on the address lines, enable a second selection signal to select a second word line in a second cell array.

2. The row decoder according to claim 1, wherein the first selection circuit comprises:
a first decoding logic coupled to the address lines, configured to enable a first driving signal in response to a first address signal of the address signals on the address lines, and disable the first driving signal in response to a second address signal of the address signals on the address lines; and
a first word line driver coupled to the first decoding logic, comprising:
a latch circuit, controlled by a latch control signal, configured to enable the first selection signal when the first driving signal is enabled during a period that the latch control signal is enabled, and latch the first selection signal during a period that the latch control signal is disabled.

3. The row decoder according to claim 2, wherein the period that the latch control signal is enabled is overlapped with that the first driving signal is enabled.

4. The row decoder according to claim 2, wherein during the period that the latch control signal is disabled, the first address provided on the address lines is switched to the second address signal.

5. The row decoder according to claim 2, wherein during the period that the latch control signal is enabled, the latch circuit disables the first selection signal when the first driving signal is disabled.

6. The row decoder according to claim 1, wherein the second selection circuit comprises:
a second decoding logic coupled to the address lines, configured to enable a second driving signal in response to a second address signal of the address signals on the address lines and disable the second driving signal in response to a first address signal of the address signals on the address lines; and
a second word line driver coupled to the second decoding logic, configured to enable the second selection signal to select the second word line when the second driving signal is enabled and disable the second selection signal to deselect the second word line when the second driving signal is disabled.

7. The row decoder according to claim 6, wherein the first address signal and the second address signal are sequentially provided on the address lines.

8. The row decoder according to claim 1, wherein the row decoder is coupled between the first cell array and the second cell array.

9. A memory system, comprising:
a first cell array comprising a first word line;
a second cell array comprising a second word line;
an address transform logic configured to provide a plurality of address signals for accessing the first cell array and the second cell array, wherein the address signals comprise a first address signal and a second address signal; and
a row decoder coupled to the first cell array and the second cell array, comprising:
a plurality of address lines coupled to the address transform logic, configured to receive the address signals from the address transform logic sequentially;
a first selection circuit coupled to the address lines and with a latch function, configured to decode the address signals on the address lines, enable and latch a first selection signal to select the first word line in response to the first address signal; and
a second selection circuit coupled to the address lines and without the latch function, configured to decode the address signals on the address lines, enable a second selection signal to select the second word line in response to the second address signal.

10. The memory system according to claim 9, wherein the first selection circuit comprises:
a first decoding logic coupled to the address lines, configured to enable a first driving signal in response to the first address signal, and disable the first driving signal in response to the second address signal; and
a first word line driver coupled to the first decoding logic, comprising:
a latch circuit, controlled by a latch control signal, configured to enable the first selection signal when the first driving signal is enabled during a period that the latch control signal is enabled, and latch the first selection signal during a period that the latch control signal is disabled.

11. The memory system according to claim 10, wherein the period that the latch control signal is enabled is overlapped with that the first driving signal is enabled.

12. The memory system according to claim 10, wherein during the period that the latch control signal is disabled, the first address provided on the address lines is switched to the second address signal.

13. The memory system according to claim 10, wherein during the period that the latch control signal is enabled, the latch circuit disables the first selection signal when the first driving signal is disabled.

14. The memory system according to claim 9, wherein the second selection circuit comprises:
a second decoding logic coupled to the address lines, configured to enable a second driving signal in response to the second address signal and disable the second driving signal in response to the first address signal; and
a second word line driver coupled to the second decoding logic, configured to enable the second selection signal to select the second word line when the second driving signal is enabled and disable the second selection signal to deselect the second word line when the second driving signal is disabled.

15. The memory system according to claim 9, wherein the row decoder is coupled between the first cell array and the second cell array.

* * * * *